United States Patent [19]

Okamoto et al.

[11] Patent Number: 5,386,623
[45] Date of Patent: Feb. 7, 1995

[54] PROCESS FOR MANUFACTURING A MULTI-CHIP MODULE

[75] Inventors: Yoshihiko Okamoto, Ohme; Hideyuki Yamada, Tokorozawa, both of Japan

[73] Assignees: Hitachi, Ltd.; Hitachi Computer Engineering Co., Ltd., Kanagawa, Japan

[21] Appl. No.: 789,249

[22] Filed: Nov. 7, 1991

[30] Foreign Application Priority Data

Nov. 15, 1990 [JP] Japan ................. 2-309259

[51] Int. Cl.⁶ .................. B23P 17/00; H05K 3/30; H05K 3/02
[52] U.S. Cl. ................................. 29/832; 29/593; 29/413; 29/846; 361/795
[58] Field of Search ............... 29/846, 852, 832, 833, 29/593, 413; 361/401, 414; 257/700, 723, 724

[56] References Cited

U.S. PATENT DOCUMENTS

| | | | |
|---|---|---|---|
| 3,757,175 | 9/1973 | Kim et al. | 257/668 |
| 4,317,274 | 3/1982 | Yasunari | 437/51 |
| 4,423,547 | 1/1984 | Farrar et al. | 437/51 |
| 4,628,590 | 12/1986 | Udo et al. | 437/51 |
| 4,783,695 | 11/1988 | Eichelberger et al. | 257/668 |
| 4,918,811 | 4/1990 | Eichelberger et al. | 29/840 |
| 5,100,812 | 3/1992 | Yamada et al. | 437/195 |

OTHER PUBLICATIONS

IEEE Transactions on Components, Hybrids, and Manufacturing Technology, vol. 12, No. 2, Jun. 1989; pp. 185–194.

*Primary Examiner*—P. W. Echols
*Attorney, Agent, or Firm*—Pennie & Edmonds

[57] ABSTRACT

A multi-chip module and a process for manufacturing the same comprises at least first and second semiconductor chips each formed with a plurality of semiconductor elements on their circuit forming surfaces and having different functions, mounted on a substrate. An insulating film is formed over the circuit forming surfaces of the first and second semiconductor chips. First and second connecting holes are formed in the insulating film over the circuit forming surfaces of the first and second semiconductor chips, respectively. A wiring layer is formed across the first and second connection holes so as to connect the first and second semiconductor chips electrically.

22 Claims, 16 Drawing Sheets

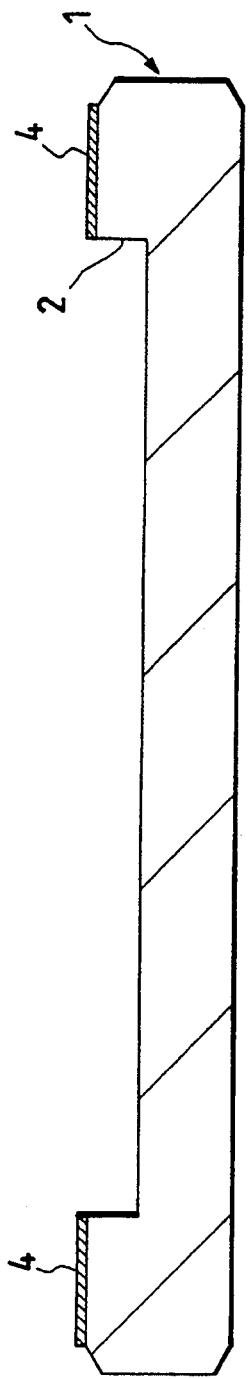
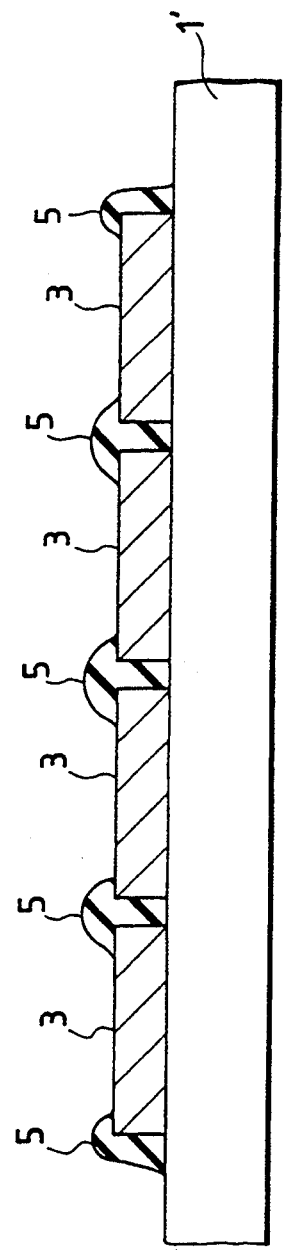
FIG. 8
FIG. 9

PROCESS FOR MANUFACTURING A MULTI-CHIP MODULE

BACKGROUND OF THE INVENTION

The present invention relates to a multi-chip module and a process for manufacturing it.

The multi-chip module is one for constructing a desired system by preparing an integrated circuit such as a CPU, a RAM, a ROM or a gate array as the unit of semiconductor chip and by packaging the chips over a wiring substrate. The method used for packaging the semiconductor chips over the substrate is exemplified by the wire bonding, TAB or flip chip method. On the other hand, the material used for the wiring substrate is exemplified by ceramics, synthetic resins or silicon wafers.

One example of the multi-chip module is described on pp. 185 to 194 of IEEE TRANSACTIONS ON COMPONENTS, HYBRIDS, AND MANUFACTURING TECHNOLOGY, VOL.12, NO.2, JUNE 1989. In this publication, there is proposed a structure for wiring the semiconductor chips and the substrate by forming the main surface of a silicon wafer with holes having a size approximately equal to that of the semiconductor chips and by patterning the wires between the semiconductor chips buried in the holes and the substrate. The wires are formed by forming the main surfaces of the semiconductor chips with wire connecting pads, by burying the semiconductor chips in the holes and by depositing a conductive film of Al or the like on the main surface of the substrate. Next, the wires are patterned by applying a photoresist to the conductive film, by subjecting the photoresist to an exposure with a wiring photo mask and then to a development, and by etching the conductive film with the resist mask obtained.

SUMMARY OF THE INVENTION

According to our examinations, the wiring method of the multi-chip module described in the aforementioned publication is accompanied by a problem in the miniaturization of the semiconductor chips, because the main surfaces of the semiconductor chips have to be formed with the wiring pads.

On the other hand, the multi-chip module is also required to shorten its development period (TAT) as the demand for a large-scale ASIC (i.e., Application Specific IC) increases. Nevertheless, the multi-chip module is accompanied by a problem not only in the elongation of the development period but also in the increase in the production cost.

In case, on the other hand, a plurality of semiconductor chips are to be packaged over a substrate, a relative dislocation occurs between the substrate and the semiconductor chips and between the semiconductor chips.

In case wires are to be formed to establish the connections between the plural semiconductor chips and between the substrate and the semiconductor chips, the pattern of a photo mask for forming the wires has to be sufficient considering the aforementioned dislocation. In other words, the wiring pads have to be enlarged. There is another problem in that the number of wires between the plural semiconductor chips and between the semiconductor chips and the substrate cannot be increased to prevent a higher integration.

The present invention has been conceived by noting the above-specified problems and to provide a technology for improving the packaging density of a multi-chip module.

Another object of the present invention is to provide a technology for shortening the development period of the multi-chip module.

Still another object of the present invention is to provide a technology for reducing the cost for manufacturing the multi-chip module.

A further object of the present invention is to provide a technology capable of realizing a high integration of the multi-chip module.

The aforementioned and other objects and novel features of the present invention will become apparent from the following description to be made with reference to the accompanying drawings.

The summary of the representative ones of the invention to be disclosed hereinafter will be briefly described in the following.

According to one aspect of the present invention, there is provided a process for manufacturing a multi-chip module, which comprises: the step of mounting on a substrate first and second semiconductor chips formed with a plurality of semiconductor elements on their circuit forming surfaces and having different functions; the step of forming an insulating film over the circuit forming surfaces of the first and second semiconductor chips; the step of forming first and second connection holes in the insulating film over the circuit forming surfaces of the first and second semiconductor chips by a direct drawing method; and the step of forming a wiring layer across the first and second connection holes so as to connect the first and second semiconductor chips electrically. The first connection holes are positioned on the first forming surfaces of the first semiconductor chips, and the second connection holes are positioned on the circuit forming surfaces of the second semiconductor chips.

According to another aspect of the present invention, there is provided a multi-chip module which comprises: a substrate; first and second semiconductor chips formed with a plurality of semiconductor elements over their circuit forming surfaces; an insulating film formed over the circuit forming surfaces of the first and second semiconductor chips; and a wiring layer extending across the first and second connection holes for connecting the first and second semiconductor chips electrically. The first and second semiconductor chips have individually different functions and are mounted on the substrate. The insulating film has first connection holes over the first semiconductor chips and second connection holes over the second semiconductor chips. Scribe areas are present around the circuit forming surfaces of the first and second semiconductor chips and are arranged with a plurality of testing pads.

BRIEF DESCRIPTION OF THE DRAWINGS

FIGS. 8, 9 to 10 are sections sequentially showing the steps of process for mounting the plural semiconductor chips on the substrate;

DESCRIPTION OF THE PREFERRED EMBODIMENTS

Figure 1:
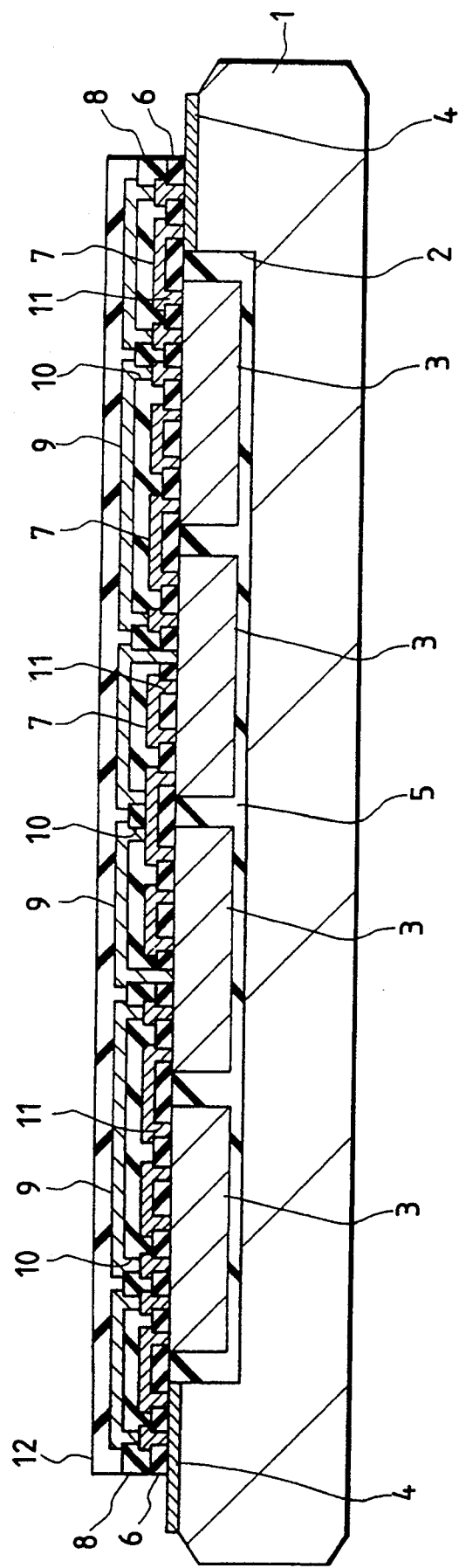
FIG. 1 is a section showing a multi-chip module according to one embodiment of the present invention.

FIG. 1 is a section showing an essential portion of a multi-chip module according to the present embodiment.

This multi-chip module has a substrate 1 formed in its main surface with a groove 2 having a flat bottom. In this groove 2, there are mounted a plurality of semiconductor chips 3, 3, - - -, and so on, which have their main surfaces leveled with one another. The main surfaces of the semiconductor chips 3 are further leveled with the outer circumferences of the main surface of the substrate 1. This substrate 1 is constructed, for example, of either a semiconductor wafer made of a single crystal of silicon or a semiconductor chip having a larger area than that of the aforementioned semiconductor chips 3.

Around the main surface of the substrate 1, there are arranged a number of lead wires 4 which constitute the input/output signal terminals and power supply terminals of the multi-chip module. The lead wires 4 are prepared, for example, such that an electrically conductive film, which is made of Al, Cu or a refractory metal deposited on the main surface of the substrate 1 by the sputtering or CVD method. The gaps between the bottoms of the semiconductor chips 3 and the substrate 1 and between the semiconductor chips 3 themselves are sealed up with an insulating filler 5 which is made, for example, of either a heat-resisting synthetic resin such as an epoxy or polyimide resin or a refractory inorganic material such as glass. The filler 5 is provided to adhere the semiconductor chips 3 and the substrate 1 or position the semiconductor chips 3 and is made of a material having a coefficient of thermal expansion equal or approximate to that of the silicon which makes the semiconductor chips 3 and the substrate 1.

The semiconductor chip 3 has its main surface covered with an insulating film 6. This insulating film 6 is made, for example, of a $SiO_2$ film which is deposited by the CVD method. Nevertheless, the material for the insulating film 6 can be exemplified by: a PSG (i.e., Phospho-Silicate Glass) film, a BSG (i.e., Boro-Silicate Glass) film or BPSG (i.e., Boro-Phospho-Silicate Glass) film, which is deposited by the CVD method; or a polyimide resin film which is applied by the spin coating method.

The first wiring layer having wires 7 is formed over the surface of the insulating film 6. A second insulating film 8 is formed over the first wiring layer. A second wiring layer having wires 9 is then formed over the surface of the second insulating film 8. The insulating film 8 is made, for example, of an insulating material which is deposited by the same method as that of the underlying insulating film 6. Those wires 7 and 9 are patterned, for example, by a later-described direct electron beam drawing method with a conductive film of Al, Cu or a refractory metal deposited by the sputtering or CVD method. Each of the wires 7 and 9 is composed of input/output signal wires and power supply wires. The upper wires 9 and the lower wires 7 are connected through connection holes 10 which are opened in the insulating film 8. Although partially omitted from FIG. 1, the lower wires 7 are directly connected with the internal wires of the semiconductor chips 3 through connection holes 11 which are respectively opened in the insulating film 6 and the passivation films of the semiconductor chips 3. Those connection holes 10 and 11 are formed by opening the insulating films 6 and 8 by the later-described direct electron beam drawing method. The wires 7 and 9 are further connected with the lead wires 4 around the substrate 1 through the connection holes 10 and 11 so that the multi-chip module is fed with a signal (or power) from an external signal source (or power source) through the lead wires 4 and the wires 7 and 9. Incidentally, the wires 9 are covered with a passivation film 12 for protecting the wires 7 and 9 and the semiconductor chips 3 from the outside. This passivation film 12 is made, for example, of: a $SiO_2$ film or a $Si_3N_4$ film, which is deposited by the CVD method; or a composite insulating film which is prepared by laminating the former two films.

Figure 2:
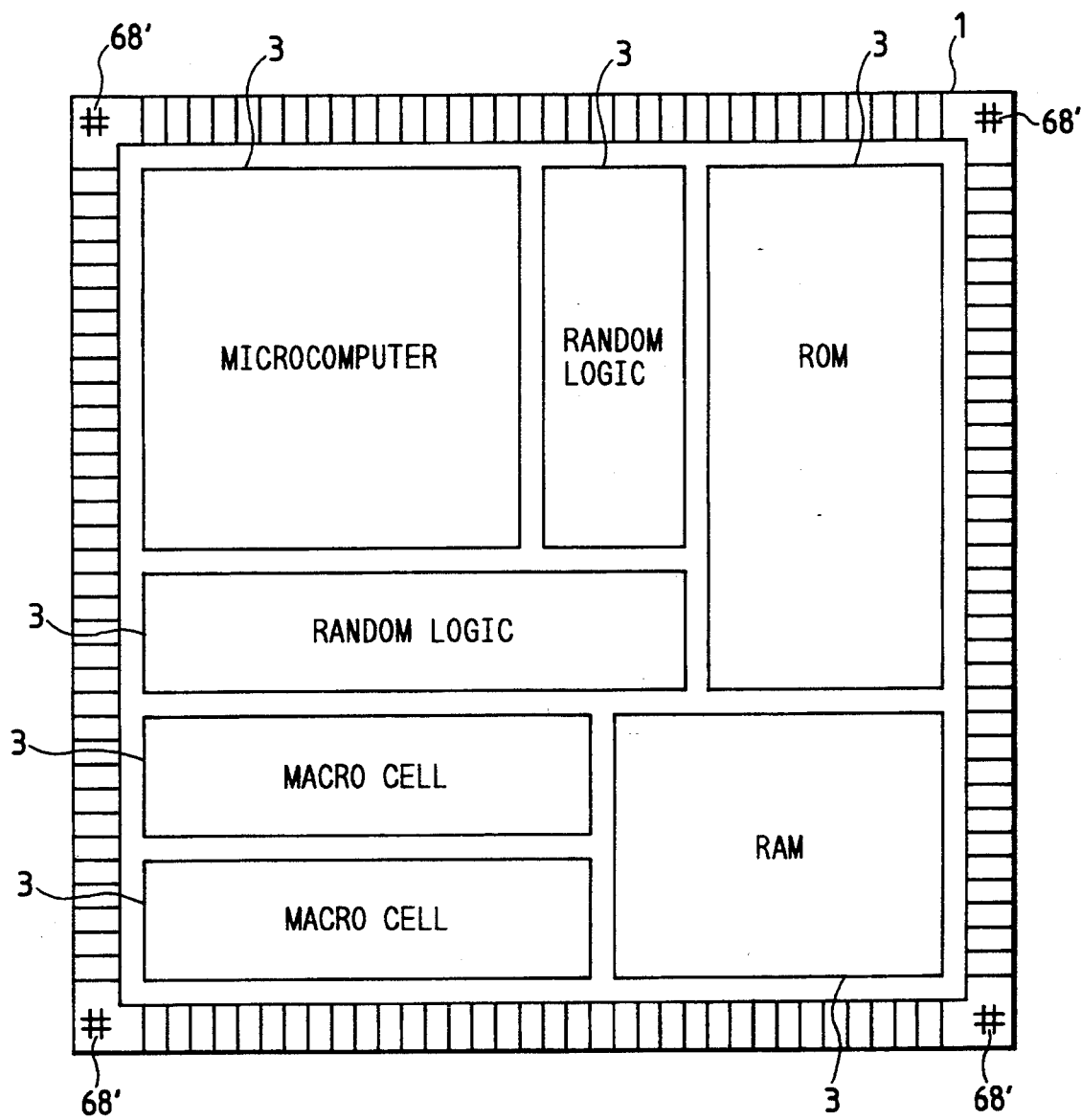
FIG. 2 is a top plan view showing the layout of a plurality of semiconductor chips mounted on a substrate.

As shown in FIG. 2, the semiconductor chips 3, 3, - - -, and so on mounted on the substrate 1 are composed, for example, of a single-chip microcomputer, a RAM, a ROM, macro cells (e.g., A/D or D/A) and random logics. Moreover, the semiconductor chip 3 of the macro cell is equipped with a plurality of I/O buffers, through which signals are exchanged between the multi-chip module and the outside. The multi-chip module of the present embodiment constitutes a predetermined system over the substrate 1 by connecting the semiconductor chips 3 through the aforementioned wires 7 and 9. Incidentally, the insulating films 6 and 8, the wires 7 and 9 and the passivation film 12 are omitted in FIG. 2 from the main surface of the semiconductor chips 3.

Thus, the multi-chip module of the present embodiment adopts the system, in which the wiring layers are formed by the direct drawing method over the main surfaces of the semiconductor chips 3, 3, - - -, and so on mounted on the substrate 1 so that predetermined ones of the semiconductor chips 3 are connected through the wires 7 and 9 of the wiring layers. As a result, different systems can be realized over the common substrate 1 merely by changing the patterns of the wires 7 and 9. This eliminates the substrate designing and preparing step of mounting the semiconductor chips on different substrates of the multi-chip module, making it possible to shorten the development term and reduce the production cost of the multi-chip module.

Figure 3:
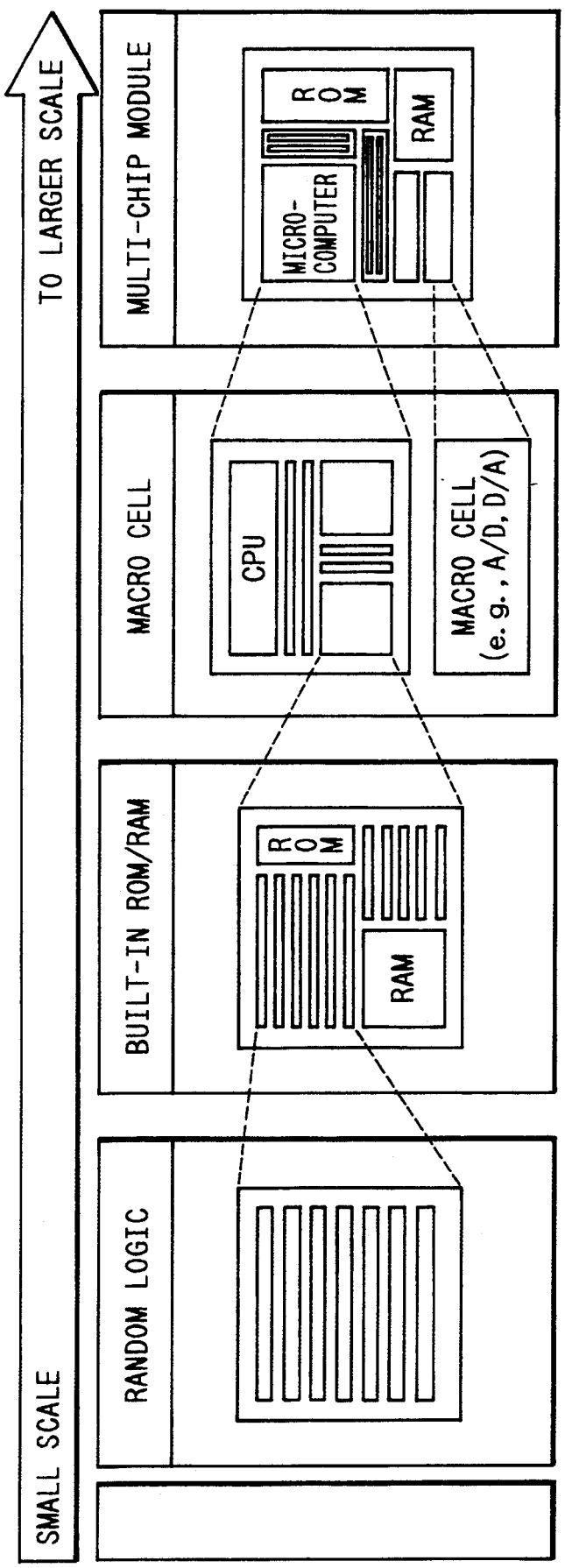
FIG. 3 is conceptional diagram for explaining a hierarchical structure of a system.

In the multi-chip module of the present embodiment, as shown in FIG. 3, the scale of the system can be hierarchically enlarged over the substrate 1. Specifically, unlike the multi-chip module of the prior art in which wires are formed in advance over the substrate for connecting the semiconductor chips, a single-chip microcomputer having a predetermined system function is deemed as a component unit (or macro cell) of a larger-scale system and is mounted together with the RAM, the ROM, the random logic and the like on the substrate 1. As a result, a large-scale system can be easily realized by changing the patterns of the aforementioned wires 7 and 9.

In the multi-chip module of the present embodiment, moreover, the predetermined ones of the semiconductor chips 3 are directly connected through the wires 7 and 9 which are patterned over the semiconductor chips 3, 3, - - -, and so on. As a result, the internal wires of the semiconductor chips 3 in contrast to the prior art, do not need to be led out to the bonding pads in the periphery so that the internal wires can be shortened to realize an accordingly high operation in the system. Moreover, each semiconductor chip 3 need not be equipped with any wiring pad and input/output buffer so that its scale can be drastically reduced to miniaturize the multi-chip module.

Still moreover, the multi-chip module of the present embodiment interconnects the internal wires of the semiconductor chips 3 through the wires 7 and the connection holes 11. In other words, some of the wires 7 substantially constitute the uppermost ones of the internal wires of the semiconductor chips 3. As a result, the internal wiring density of the semiconductor chips 3 can be reduced to improve the degree of freedom of the wiring design thereby to shorten the development term of the multi-chip module.

Figure 4:
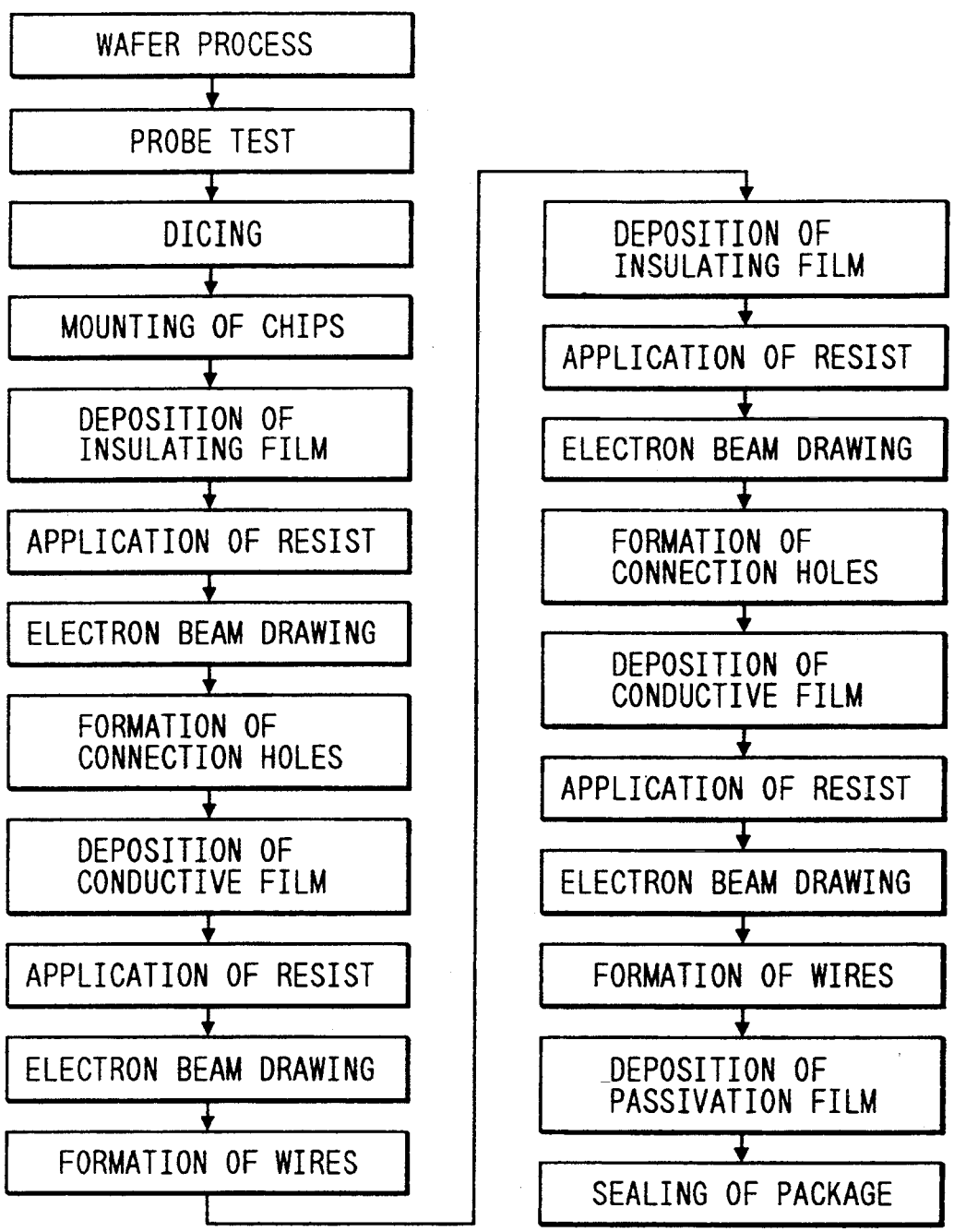
FIG. 4 is a flow chart showing the steps of manufacturing the multi-chip module.

Next, one example of the process for manufacturing the multi-chip module having the structure thus far described will be described with reference to the flow-chart shown in FIG. 4.

Figure 5:
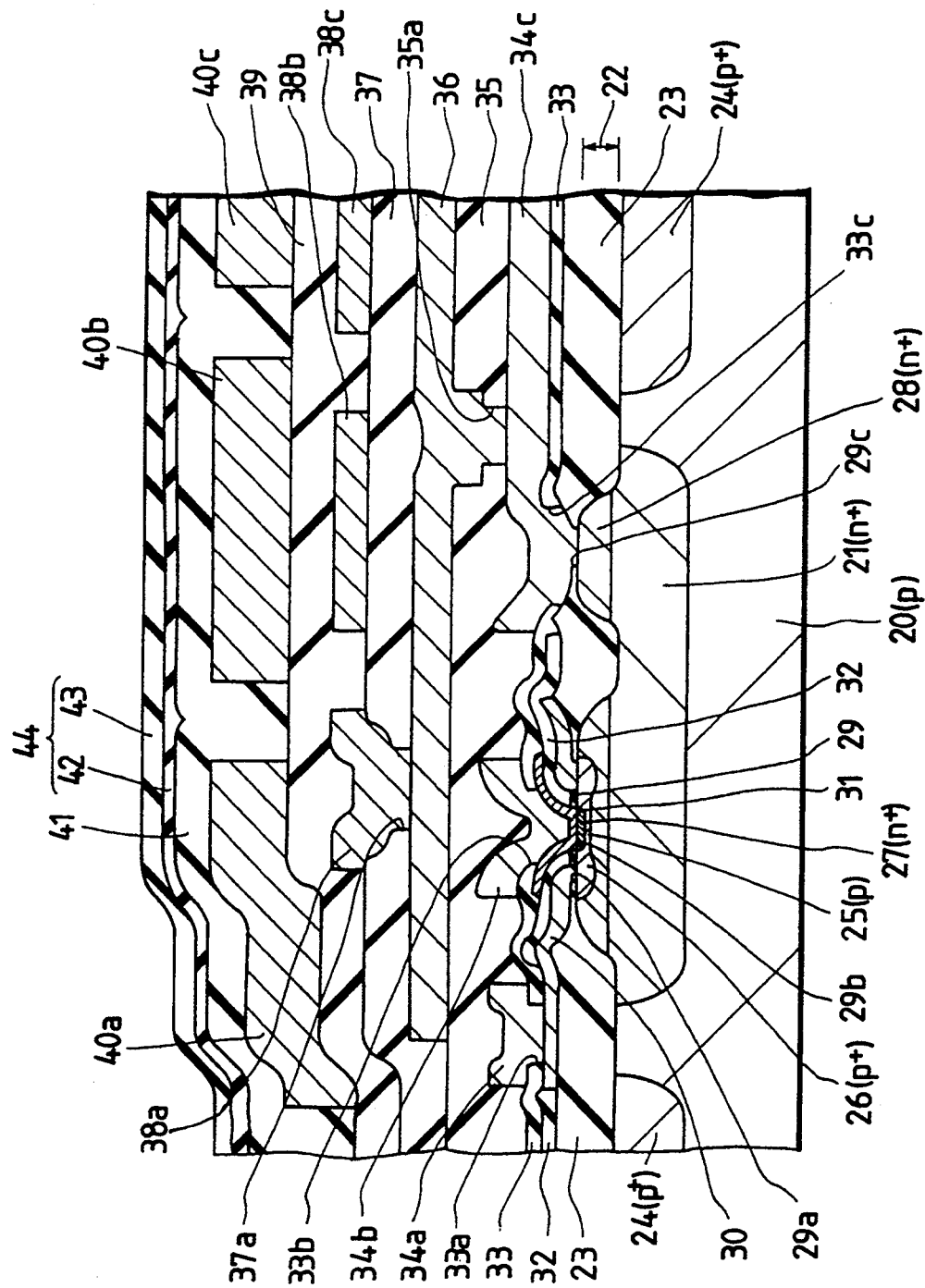
FIG. 5 is a section showing an essential portion of one semiconductor chip in the multi-chip module.

At first, in accordance with the well-known wafer process (e.g., the CMOS process or bipolar process), an integrated circuit such as the aforementioned CPU, RAM, ROM and gate array is formed over the main surface of a semiconductor wafer. FIG. 5 is a section showing the semiconductor wafer exemplifying the above-specified integrated circuit. As shown, for example, a semiconductor wafer 20(p) made of p-type silicon is formed with an n+-type buried layer 21n+. The semicondutor wafer 20(p) is further formed thereover with an epitaxial layer 22 made of n-type silicon. This epitaxial layer 22 is formed in its predetermined region with a field insulating film 23 made of an $SiO_2$ film for separating the elements from one another and the insides of the elements. Below the field insulating film 23, there is formed a p+-type channel stopper region 24(p+). The region of the epitaxial layer 22, which is surrounded by the field insulating film 23, is formed with a p-type intrinsic base region 25 and a p+-type external base region 26. The intrinsic base region 25 is formed therein with an n+-type emitter region 27. The aforementioned emitter region 27 and intrinsic base region 25 and the collector region, which is composed of the epitaxial layer 22 and the buried layer 21n+ below the intrinsic base region, constitute an npn-type bipolar transistor. Incidentally, reference numeral 28 appearing in the same Figure designates an n+-type collector lead-out region connected with the buried layer 21n+.

An insulating film 29, which merges into the aforementioned field insulating film 23 and is made of a $SiO_2$ film thinner than the field insulating film 23, is formed with connection holes 29a to 29c, which are located to correspond to the aforementioned external base region 26, emitter region 27 and collector lead-out region 28, respectively. Through these connection holes 29a to 29c, a base lead-out electrode 30, which is made of a polycrystal silicon film doped with a p-type impurity such as boron, is connected with the external base region 26. The emitter region 27 is formed thereover with an emitter lead-out electrode which is made of a polycrystal silicon film doped with an n-type impurity such as phosphor or arsenic. Incidentally, reference numerals 32 and 33 designate insulating films which are made of $SiO_2$, for example.

Reference numerals 34a to 34c designate first-layer wires which are made of an Al film, for example. The wire 34a is connected with the base lead-out electrode 30 through a connection hole 33a formed in the insulating film 33; the wire 34b is connected with the emitter electrode 31 through a connection hole 33b; and the wire 34c is connected with the collector lead-out region 28 through a connection hole 33c and the connection hole 29c. Moreover, reference numeral 35 designates an inter-layer insulating film which is formed by laminating a $Si_3N_4$ film, a spin-on glass film and a $SiO_2$ film, for example. The inter-layer insulating film 35 is formed thereover with a second-layer wire 36 which is made of an Al film, for example. The wire 36 is connected with the second-layer wire 34c through a connection hole 35a which is opened in the inter-layer insulating film 35. Moreover, the connection hole 35a has a stepped shape for improving the step coverage of the wire 36 in the connection hole 35a.

Reference numeral 37 designates a second inter-layer insulating film which has a structure similar to that of the aforementioned inter-layer insulating film 35. The second inter-layer insulating film 35 is formed thereover with third-layer wires 38a to 38c, which are made of an Al film, for example. The wire 38a is connected with the second-layered wire 36 through the connection hole opened in the inter-layer insulating film 37. Moreover, reference numeral 39 designates a third inter-layer insulating film which as a structure similiar to those of the aforementioned inter-layer insulating films 35 and 37. The third inter-layer insulating film 39 is formed thereover with fourth-layer wires 40a to 40c, which are made of an Al film, for example. These wires 40a to 40c are provided for the power supply and made wider and thicker than the underlying wires so that they can supply a high current.

Reference numeral 41 designates a surface flattening insulating film, which is made of a $SiO_2$ film deposited by either the bias sputtering method or the combination of the CVD method and the sputter etching method, for example. On the other hand, the material to be used for the insulating film 41 can be exemplified by the PSG film, BSG film or BPSG film which is deposited by the combination of the CVD method and the sputter etching method. The insulating film 41 is formed thereover with a passivation film 44, which is prepared by laminating a $Si_3N_4$ film 42 and a $SiO_2$ film 43 deposited by the plasma CVD method, for example.

Figure 6:
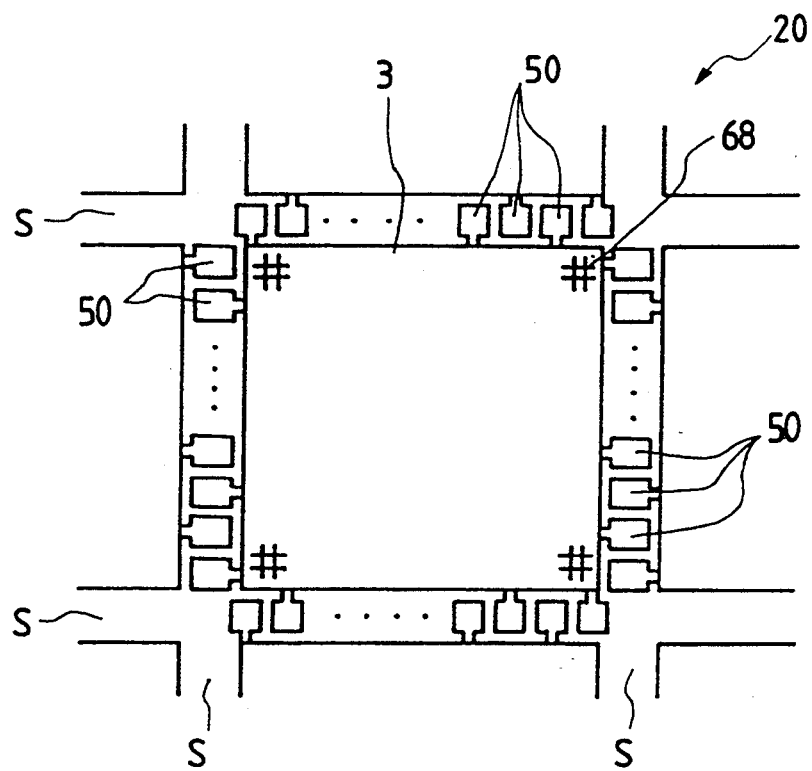
FIGS. 6 and 7 are top plan views individually showing an essential portion of a semiconductor wafer which is formed with a plurality of semiconductor chips in the multi-chip module.
Figure 7:
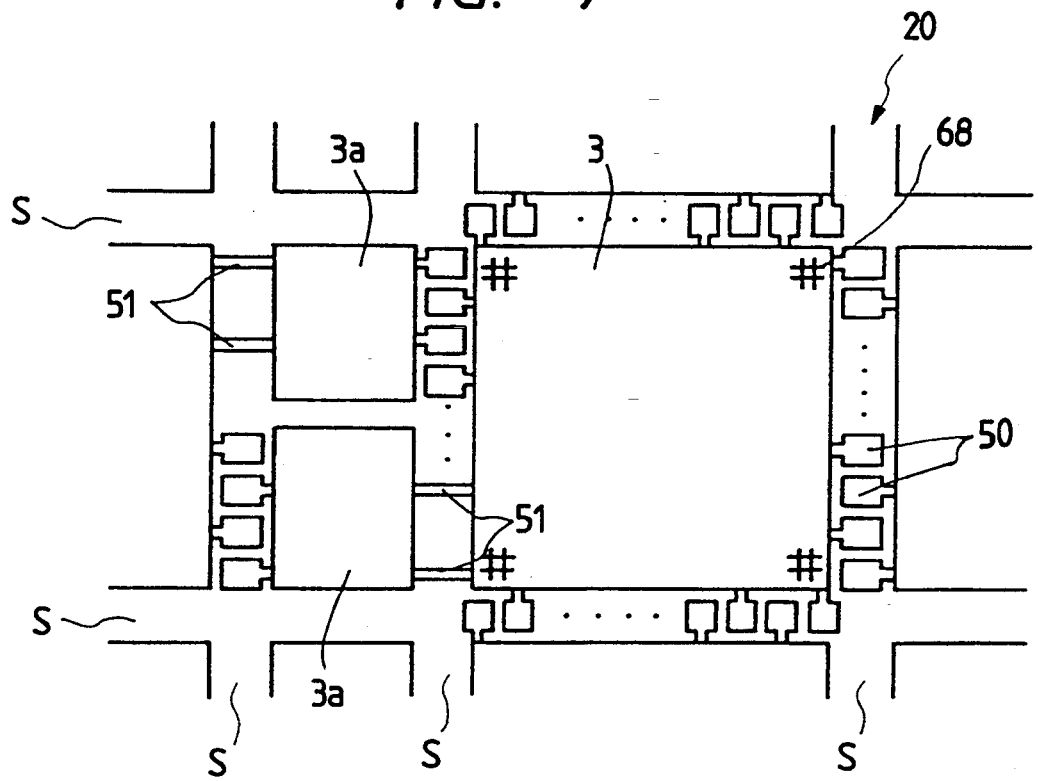

FIGS. 6 and 7 are top plan views showing portions of the individual semiconductor wafers 20(p) which are formed with the aforementioned integrated circuit.

As shown in FIG. 6, the semiconductor wafer 20(p) is formed over its main surface with a number of semiconductor chips 3 in a lattice form such that the individual semiconductor chips 3 are isolated from one another by scribe lines S. These scribe lines S are formed thereover with a number of testing pads 50 which are connected with the semiconductor chips 3. The testing pads 50 are made of the common conductive film (e.g., the Al film), which is formed at the same manufacture step as that of the internal wires of the semiconductor chips 3. The insulating film 41 and the passivation film 44, which are formed over the semiconductor chips 3 in the wafer process, are removed from the scribe lines S so that the numerous testing pads 50 have their surfaces exposed to the outside. The probe test of FIG. 4 is accomplished by applying a probe to the testing pads 50. Thus, it is decided whether each of the semiconductor chips 3 in the semiconductor wafer 20(p) is good or not. As shown in FIG. 7, on the other hand, the remaining region of the main surface of the semiconductor wafer 20(p) is formed with testing chips 3a which have a smaller size than that of the semiconductor chips 3. The testing chips 3a are connected with the semiconductor chips 3 through wires 51 which are formed over the scribe lines S. The wires 51 are made of the fourth-layer Al wiring layer, i.e., the same conductive film as that which is formed at the step of forming the internal wires of the semiconductor chips 3 and the testing pads 50. The testing chips 3a are formed over their main surfaces with test circuits (e.g., test pattern generating circuits or test result analyzing circuits) for testing the operating states of the integrated circuit formed in the semiconductor chips 3. The testing circuits are formed simultaneously with the step of forming the integrated circuits over the main surface of the semiconductor chips 3.

The semiconductor wafer 20(p) having completed the aforementioned wafer process is transferred to the test step, at which the propriety of each of its semiconductor chips 3 is decided by the probe test. This probe test is accomplished by abutting the probe against each of the testing pads 50 formed over the scribe lines S. Moreover, a test executing instruction is given through the testing pads 50 to the testing chips 3a to test the propriety of the semiconductor chips 3 in more detail. After this, the semiconductor wafer 20(p) is diced to separate the semiconductor chips 3. By this dicing step, the testing pads 50 and the testing chips 3a are cut off from the semiconductor chips 3. Incidentally, the wires 51 for connecting the semiconductor chips 3 and the testing chips 3a and the testing pads 50 over the scribe lines may be etched off prior to the aforementioned dicing step by using the aforementioned passivation film 44 over the surfaces of the semiconductor chips 3 as the mask.

Thus, according to the manufacturing process of the present embodiment, the testing pads 50 connected with the semiconductor chips 3 are formed over the scribe lines S of the semiconductor wafer 20(p) so that the probe tests can be executed without providing the pads in the semiconductor chips 3.

According to the manufacturing process of the present embodiment, moreover, the remaining region of the semiconductor wafer 20(p) is formed with the testing chips 3a having the test circuits so that the propriety of the semiconductor chips 3 can be tested in detail through those testing chips 3a. This makes it unnecessary to form the aforementioned test circuits in the semiconductor chips 3 so that the areas of the semiconductor chips 3 can be accordingly reduced.

Figure 10:
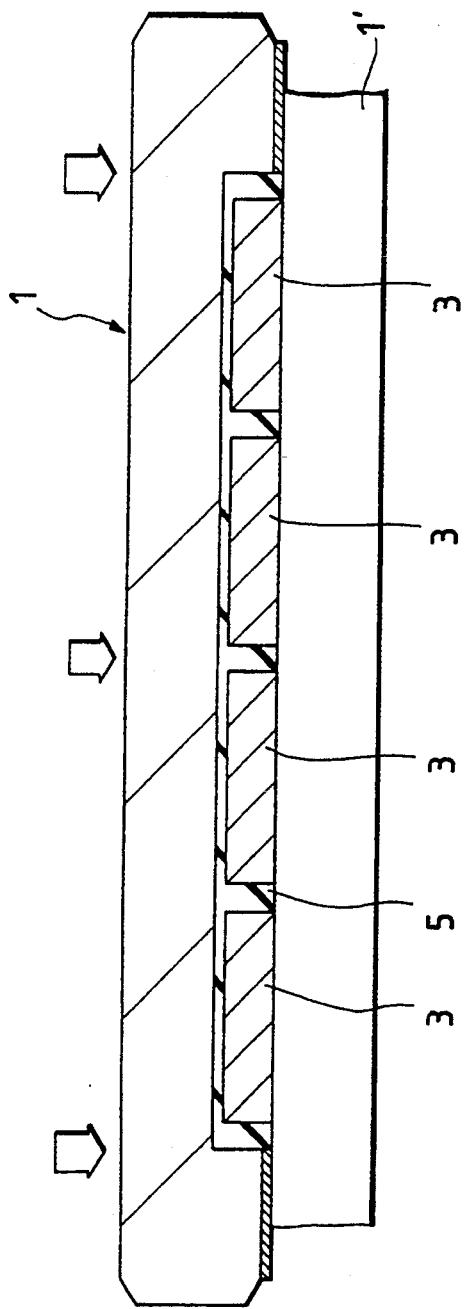

Next, the method of mounting the semiconductor chips 3 on the substrate 1 will be described with reference to FIGS. 8 to 10.

At first, as shown in FIG. 8, the semiconductor wafer or the semiconductor chip having a large area has its main surface etched to form the groove 2. After this, the lead wires 4 are formed along the outer periphery of the groove 2 to prepare the aforementioned substrate 1. Next, in order to level the main surfaces of the semiconductor chips 3, as shown in FIG. 9, the semiconductor chips 3 are mounted with their main surfaces inverted on a positioning plate 1' having a flat surface, and the gaps of the semiconductor chips 3 are filled up with the filler 5 which is made of a heat-resisting synthetic resin such as an epoxy resin. Next, as shown in FIG. 10, the substrate 1 is pushed onto the back surfaces of the semiconductor chips 3 to spread the filler 5 all over the gaps between the semiconductor chips 3 and the substrate 1. After this, the filler 5 is hardened by heating means to fix the semiconductor chips 3 over the main surface of the substrate 1. The groove 2 of the substrate 1 is made deeper than the thickness of the semiconductor chips 3. In case the semiconductor chips 3 are packaged by spreading the filler 5 between the semiconductor chips 3 and the bottom of the groove 2 of the substrate 1, the main surfaces of the semiconductor chips 3 and the main surface of the substrate 1 are set at substantially the same level. Incidentally, another method of mounting the semiconductor chips 3 on the substrate 1 can also be exemplified by the anodic bonding method. Specifically, the substrate 1 and the semiconductor chips 3 are bonded, while the oxygen ions in the glass having a coefficient of thermal expansion approximate to that of silicon are diffusing into the substrate 1 and the semiconductor chips 3, by sandwiching the glass between the substrate 1 and the semiconductor chips 3 and by applying a DC voltage of 500 to 1,000 V positively to the substrate 1 and the semiconductor chips 3 and negatively to the glass in the heating atmosphere of 300° to 500° C.

Next, on the basis of the inter-chip wiring data file prepared for each kind, the semiconductor chips 3 have their main surfaces patterned with the aforementioned wires 7 and 9. The patterns of the wires 7 and 9 are formed by the direct electron beam drawing method or the direct laser drawing method based on the aforementioned inter-chip wiring data file.

Figure 11:
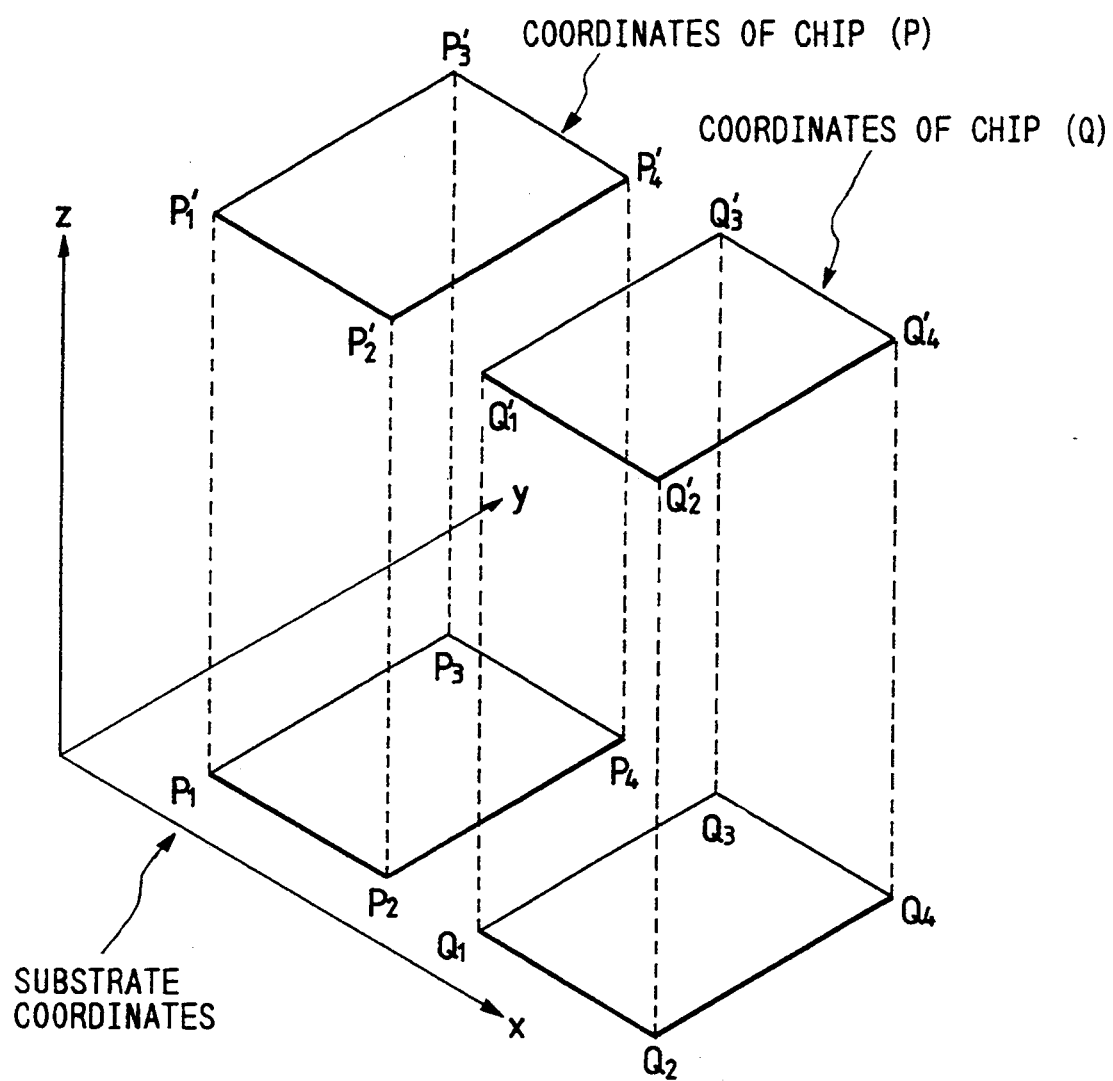
FIG. 11 is a diagram for explaining a method of correcting the position and height of a semiconductor chip mounted on the substrate.

Specifically, the insulating film 6 made of a SiO$_2$ film, for example, is deposited by the CVD method on the main surfaces of the semiconductor chips 3 mounted on the substrate 1. After this, an electron beam resist is applied to the insulating film 6 and has its predetermined region exposed to the electron beam until it is developed. The assignment of the coordinates of the region to be exposed to the electron beam is executed by measuring a mark, which is formed in advance in the main surface of each semiconductor chip 3 to detect the position and height of thereof. This mark is formed, for example, on the uppermost layer wires (made of aluminum or the like) in the chip. Since the mark is covered with the passivation film 44 and the insulating films 41 and 6, the beam accelerating voltage of the electron beam drawing apparatus is the more advantageous if it is the higher (e.g., 50 KV in the present embodiment). Moreover, the semiconductor chips 3 are mounted on the substrate 1 with their main surfaces at substantially the same level and their mutual positions identified to one another, but may have different heights and positions due to the dispersion at the manufacturing step and the warp of the semiconductor wafer 20(p). As shown in FIGS. 6 and 7, therefore, marks 68 for detecting the aforementioned positions and heights are formed at the four corners of each semiconductor chip 3. As shown in FIG. 11, the positions and heights of the marks 68 of the individual semiconductor chips (P, Q, - - - ) are measured to take the correlations between the following designed coordinates and actual positional coordinates:

Designed Coordinates:
$Pi(x, y, z)$;
$Qi(x, y, z)$;
...
($i = 1$ to 4);

Actual Positional Coordinates:
$Pi'(x, y, z)$;
$Qi'(x, y, z)$;
...
($i = 1$ to 4).

The positions in the semiconductor chips are linearly interpolated on the basis of the mark positions, and the positions between the semiconductor chips are linearly interpolated on the basis of the mark positions of the semiconductor chips. Ordinally, the semiconductor chips 3 have an area of about 10 mm×10 mm, and the mounting distortion on the substrate 1 is, as follows:

Plane Position: about $\pm 20$ $\mu$m;

and

Height Position and Gradient: about $\pm 2$ $\mu$m, so that the coordinates of the exposed region can be corrected by the aforementioned linear interpolations.

As shown in FIG. 2, moreover, the main surface of the substrate 1 has its four corners formed with position and height detecting marks 68'. In case the wires between the substrate i and the semiconductor chips 3 are to be formed, the linear interpolations are executed on the basis of the mark positions of the substrate 1 and the semiconductor chips 3, as has been described hereinbefore.

Figure 12:
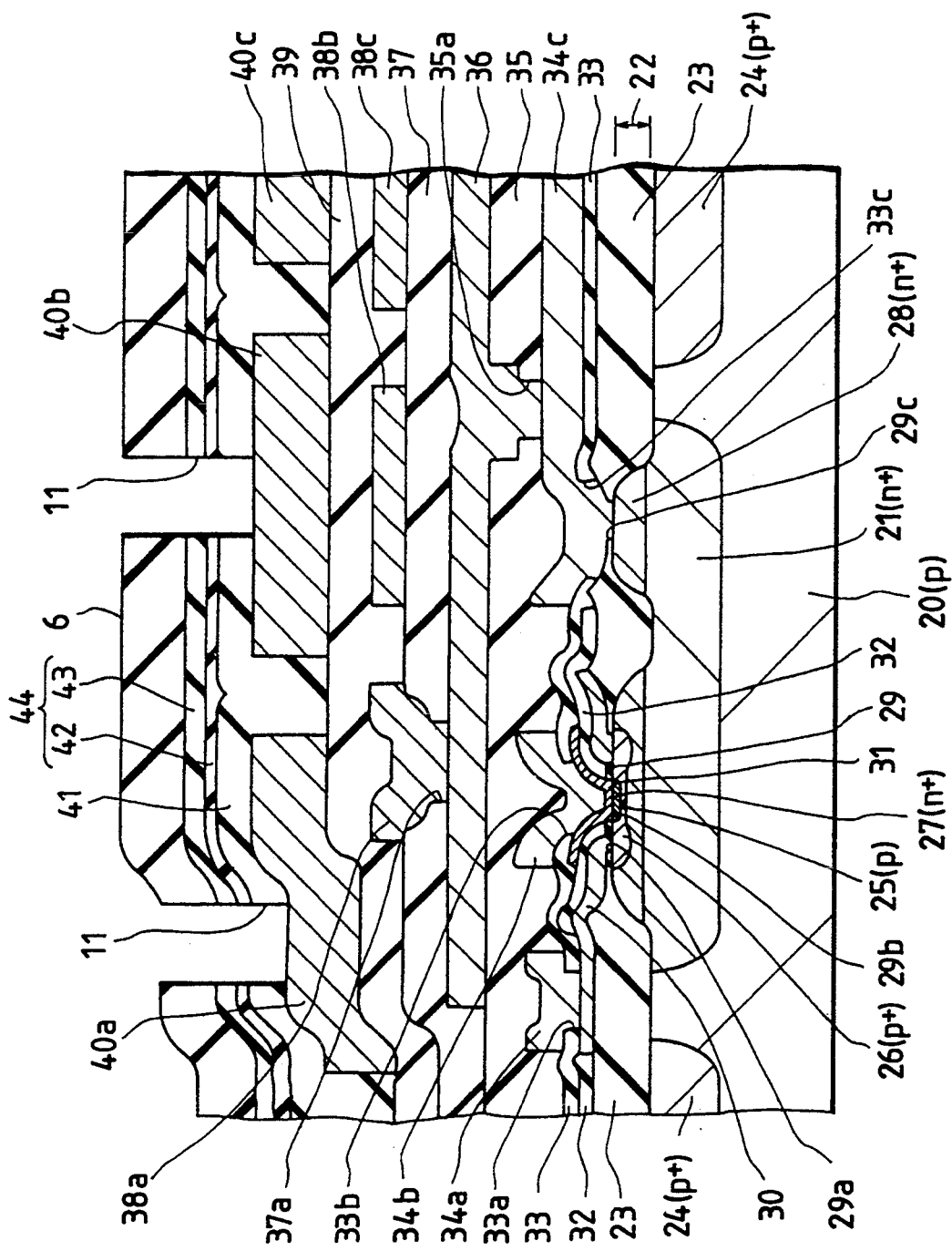
FIGS. 12 and 13 are sections sequentially showing the steps of a method of forming wires over the main surfaces of the plural semiconductor chips packaged over the substrate.
Figure 13:
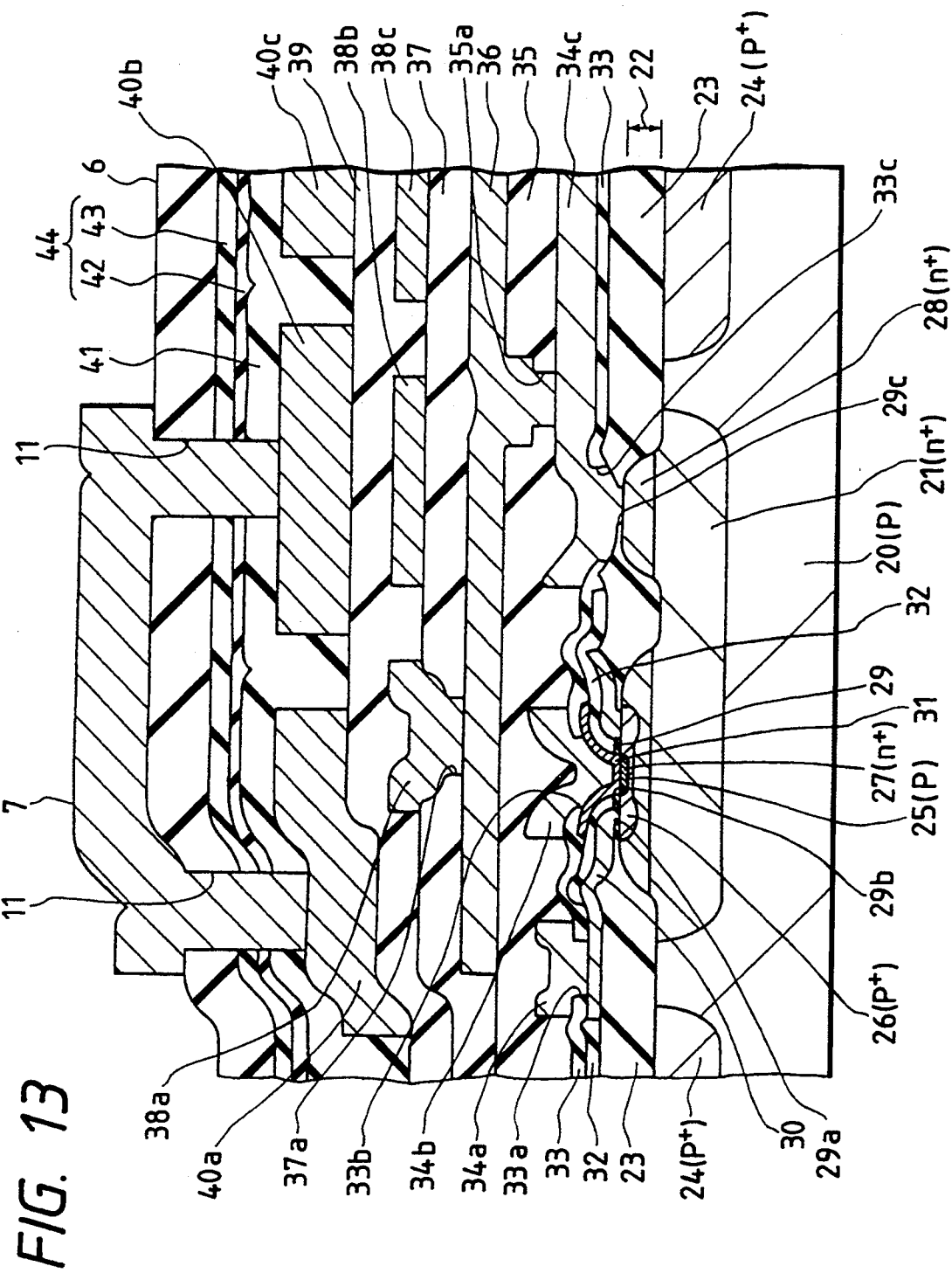

Next, the resist mask obtained by the aforementioned operations is used to etch the aforementioned insulating film 6 and the insulating film 41 and passivation film 44 of the underlying semiconductor chips 3 to open the connection holes 11 which reach the uppermost wires 40a to 40c of the semiconductor chips 3, as shown in FIG. 12. Subsequently, a conductive film made of an Al film, for example, is deposited on the insulating film 6 by the sputtering method. After this, the electron beam resist is applied to the conductive film and has its predetermined region exposed to the electron beam until it is developed. Incidentally, the assignment of the coordinates of the exposed region is executed by the aforementioned method. Next, the wires 7 are formed by etching the conductive film with the resist mask thus obtained by the aforementioned operations. FIG. 13 is a section showing the state, in which the uppermost-layer wires 40a and 40b of the semiconductor chip 3 are connected through the aforementioned wire 7.

After this, the deposition of the second-layer insulating film 8, the opening of the connection holes 10, and the formation of the second-layer wires are sequentially executed by the methods like the aforementioned ones, and the multi-chip module, as shown in FIG. 1, is finally completed by depositing the passivation film 12. Incidentally, the similar methods can also be employed in case the aforementioned direct electron beam drawing method is replaced by the direct laser drawing method.

Figure 15:
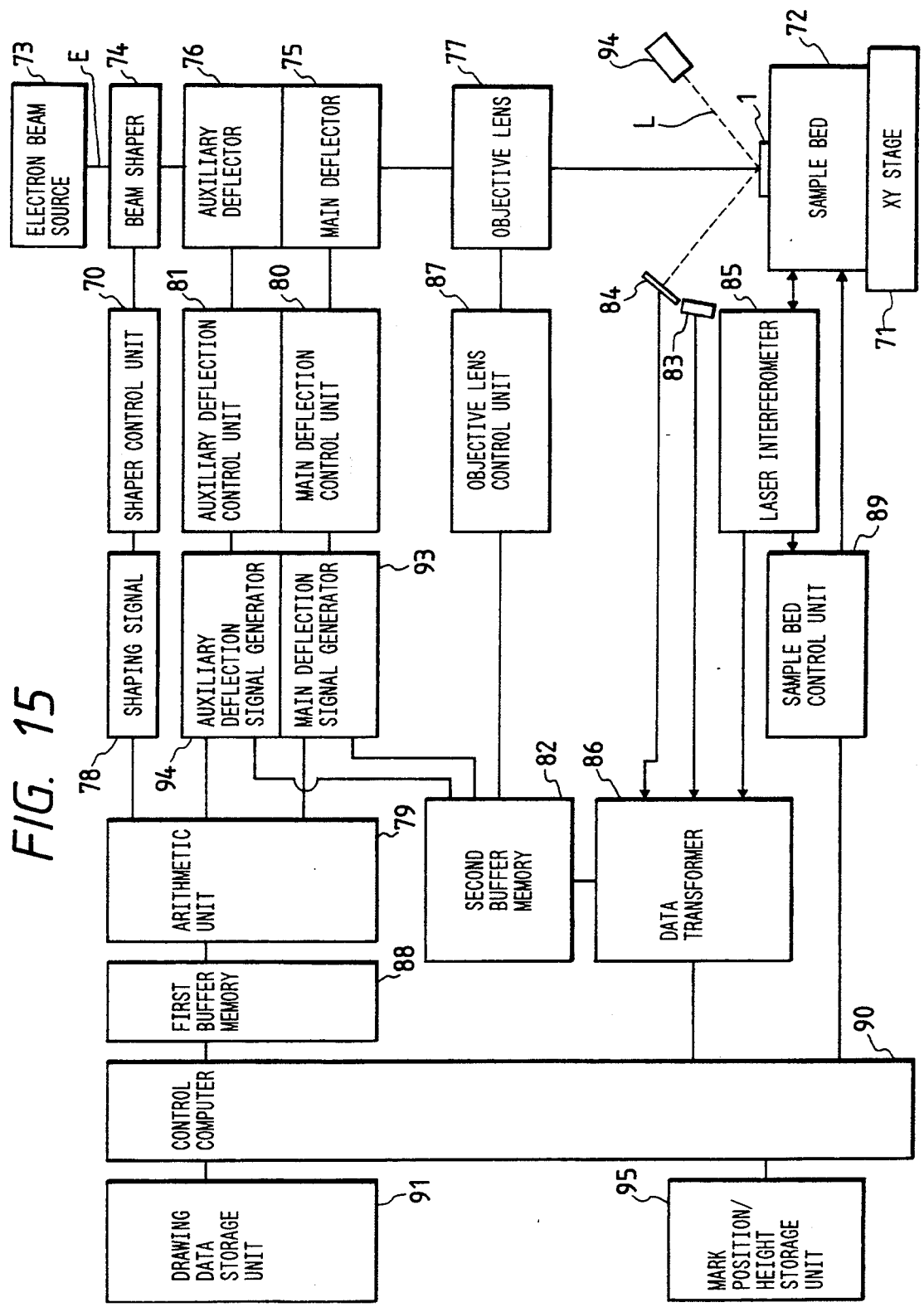
FIG. 15 is a schematic diagram showing an electron beam drawing apparatus to be used in the present invention.

FIG. 15 is a section showing an essential portion of the electron beam drawing apparatus according to the present embodiment. The substrate 1 packaged with the plural chips 3 is positioned on a sample bed 72 which is carried by an XY stage 71 made movable in a horizontal plane. An insulating film of $SiO_2$, which is deposited in advance by the CVD method, for example, is deposited on the main surface of the substrate 1, and an electron beam resist is spin-applied to the insulating film.

Above the sample bed 72, there is disposed an electron optical system which is composed of an electron beam source 73, a beam shaper 74, a main deflector 75, an auxiliary deflector 76 and an objective lens 77. The main surface of the substrate 1 is irradiated in an assigned size with an electron beam (E), which is emitted from the aforementioned electron beam source 73 and has a fine beam diameter of about 0.1 to 0.5 $\mu$m.

The beam shaper 74 is connected with an arithmetic unit 79 through a shaper control unit 70 and a shaping signal generator 78. The main deflector 75 and the auxiliary deflector 76 are connected with the aforementioned arithmetic unit 79 and a rapidly accessible second buffer memory 82, respectively, through a main deflection control unit 80 and a main deflection signal generator 93 and through an auxiliary control unit 81 and an auxiliary deflection signal generator 94.

The second buffer memory 82 is connected with a data transformer 86 for analog/digital transformations and coordinate transformations of the individual signals coming from a mark position detector 83, a height detector 84 and a laser interferometer 85, which are individually arranged in the vicinity of the sample bed 72. The height detector 84 detects the height of the optically irradiated position on the substrate 1 by detecting the reflected light of a light (L) which is obliquely emitted onto the substrate 1 from the light source 94.

The objective lens 77 is connected with a control computer 90 through an objective lens control unit 87 and the second buffer memory 82. On the other hand, the arithmetic unit 79 is connected with the control computer 90 through a rapidly accessible first buffer memory 88. Moreover, the sample bed 72 is connected with the control computer 90 through a sample bed control unit 89.

The control computer 90 is constructed of a drawing data storage unit 91, a mark position/height data storage unit 95, a high capacity storage device such as a not-shown hard disc, an input/output device such as a VDT, and a CPU. The drawing data storage unit 91 is stored with massive drawing information to be drawn on the substrate 1 so that the drawing information selected suitably by the control program is transferred, if necessary, to the first buffer memory 88. On the other hand, the mark position/height data storage unit 95 is stored with the mark position data and height data, which are obtained from the mark position detector 83 and the height detector 84, so that the data of the region selected suitably by the control program is transferred, if necessary, to the second buffer memory 82.

Next, the exposure method using this electron beam drawing apparatus will be described with reference to FIGS. 16, 17 and 11.

Figure 16:
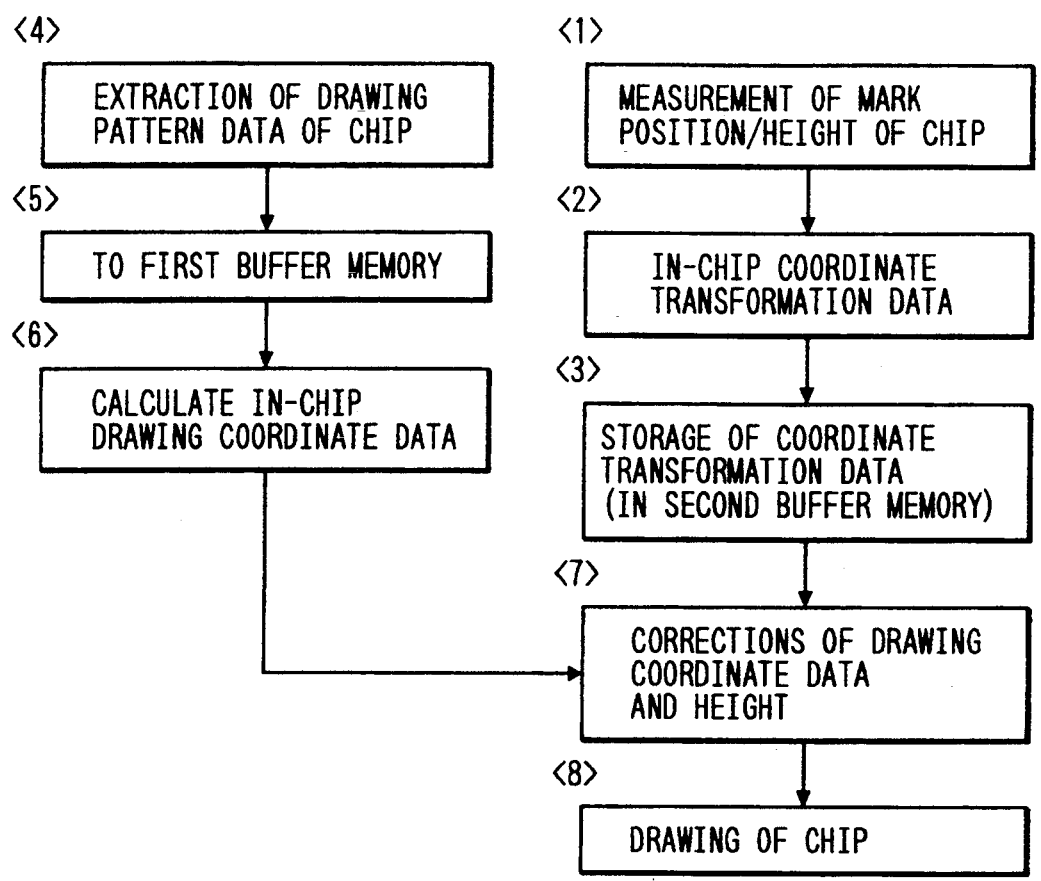
FIGS. 16 and 17 are flow charts showing a drawing method using the electron bean drawing apparatus.
Figure 17:
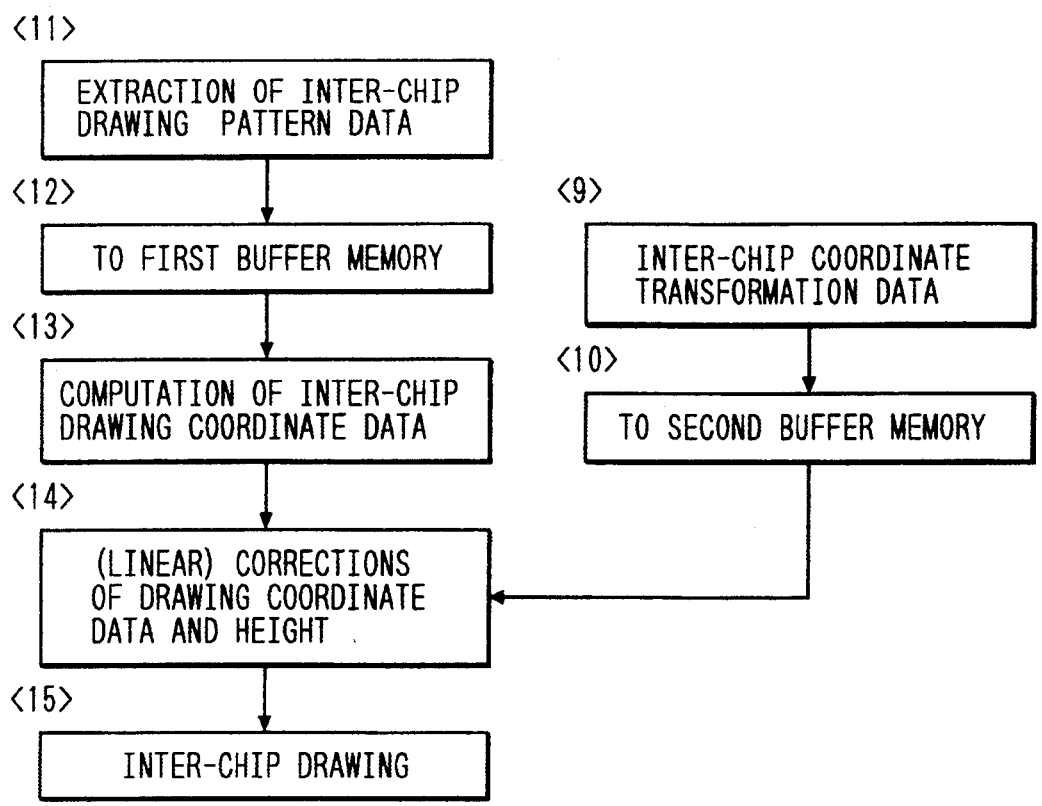

At first, prior to the exposure, the position and height of a positioning mark (M) of a predetermined chip 3 packaged on the substrate 1 are measured <1>, as shown in FIG. 16. The measurement of the position of the mark (M) is executed by scanning each chip 3 with the electron beam (E) and by measuring the position of the sample bed 72 with the laser interferometer 85. On the other hand, the measurement of the height of the mark (M) is executed by irradiating each chip 3 obliquely with the light (L) coming from the light source 94 and by detecting the reflected light with the height detector 84.

Subsequently, the measured data have their coordinates transformed <2> into the coordinate system of the substrate 1 by the data transformer 86, and these coordinate-transformed data are stored in the mark position/height data storage unit 95 and transferred <3> to the second buffer memory 82.

Next, the drawing pattern data of the chip 3 are extracted <4> from the drawing data storage unit 91 of the control computer 90 and transferred <5> to the first buffer memory 88 and further to the arithmetic unit 79. This arithmetic unit 79 calculates <6> the drawing coordinate data by arithmetically operating the drawing pattern data transferred from the buffer memory 88 and converts the drawing coordinate data into control signals relating to the shape and deflection of the electron beam (E). These control signals are individually outputted to the shaping signal generator 78, the main deflection signal generator 93 and the auxiliary deflection generator 94.

The shaper control unit 70 controls the beam shaper 74 on the basis of the aforementioned control signals outputted from the shaping signal generator 78. The main deflection signal generator 93 and the auxiliary deflection signal generator 94 output the control signals as well as the coordinate-transformed data of the position of the mark (M) of the chip 3, which are stored in the second buffer memory 82, to the main deflection control unit 80 and the auxiliary deflection control unit 81. The coordinate-transformed data of the height of the mark (M) of the chip 3 are outputted to the objective lens control unit 87.

The main deflection control unit 80, the auxiliary deflection control unit 81 and the objective lens control unit 87 correct <7> the drawing coordinate data on the basis of the coordinate-transformed data of the position and height of the mark (M) of the chip 3 so that the chip 3 is drawn <8> by controlling the main deflector 75, the auxiliary deflector 76 and the objective lens 77 on the basis of the drawing coordinate data corrected.

For the drawing between the chips 3, on the other hand, one and adjacent chips 3 are assigned from the plurality chips 3. Subsequently, as shown in FIG. 17, the coordinate-transformed data of the positions and heights of the individual marks (M) of those two chips 3 are extracted from the mark position/height data storage unit 95 of the control computer and transformed to the data transformer 86, in which the coordinate-transformed data between the two chips 3 are prepared <9> from the two coordinate-transformed data and transferred <10> to the second buffer memory 82.

Next, the drawing pattern data between the aforementioned chips 3 are extracted <11> from the drawing data storage unit 91 of the control computer 90 and are transformed <12> to the first buffer memory 88 and further to the arithmetic unit 79. This arithmetic unit 79 arithmetically operates the drawing pattern data, which are transformed from the buffer memory 88, to compute the drawing coordinate data <13> to transform them to control signals. These control signals are individually outputted to the shaping signal generator 78, the main deflection signal generator 93 and the auxiliary deflection signal generator 94.

The main deflection control unit 80, the auxiliary deflection control unit 81 and the objective lens control unit 87 correct <14> the drawing coordinate data between the chips 3 on the basis of the coordinate-transformed data between the chips 3 stored in the second buffer memory 82, to effect the drawing between the chips 3 <15> on the basis of the drawing coordinate data corrected. The corrections of the drawing coordinate data between the chips 3 are executed, for example, by measuring the two or more individual positioning marks (M) of the adjacent chips (P, Q) and the heights of the same, as shown in FIG. 4, and by preparing the corrected coordinates through the linear interpolations.

By sequentially drawing the insides of the individual chips 3 and between the chips 3, as has been described above, the electron beam (E) can be precisely positioned to improve the production yield and reliability of the multi-chip module even if a discrepancy is caused between the actual and designed positions of the plural chips 3 packaged on the substrate 1 and if the chips 3 have their main surfaces inclined with respect to the main surface of the substrate.

Thus, in the manufacturing process of the present embodiment, the direct electron beam drawing method or the direct laser drawing method is used to pattern the wires 7 and 9 and to open the connection holes 10 and 11 so that the steps of the wiring photo masks for the individual kinds can be eliminated to shorten the development term of the multi-chip module and to reduce the production cost of the same.

In the manufacture process of the present embodiment, moreover, the position and height detecting marks 68 formed at the four corners of the semiconductor chips 3 are used to correct the coordinates of the exposed region so that the working accuracies of the wires 7 and 9 and the connection holes 10 and 11 can be improved to increase the production yield of the multi-chip module.

Figure 14:
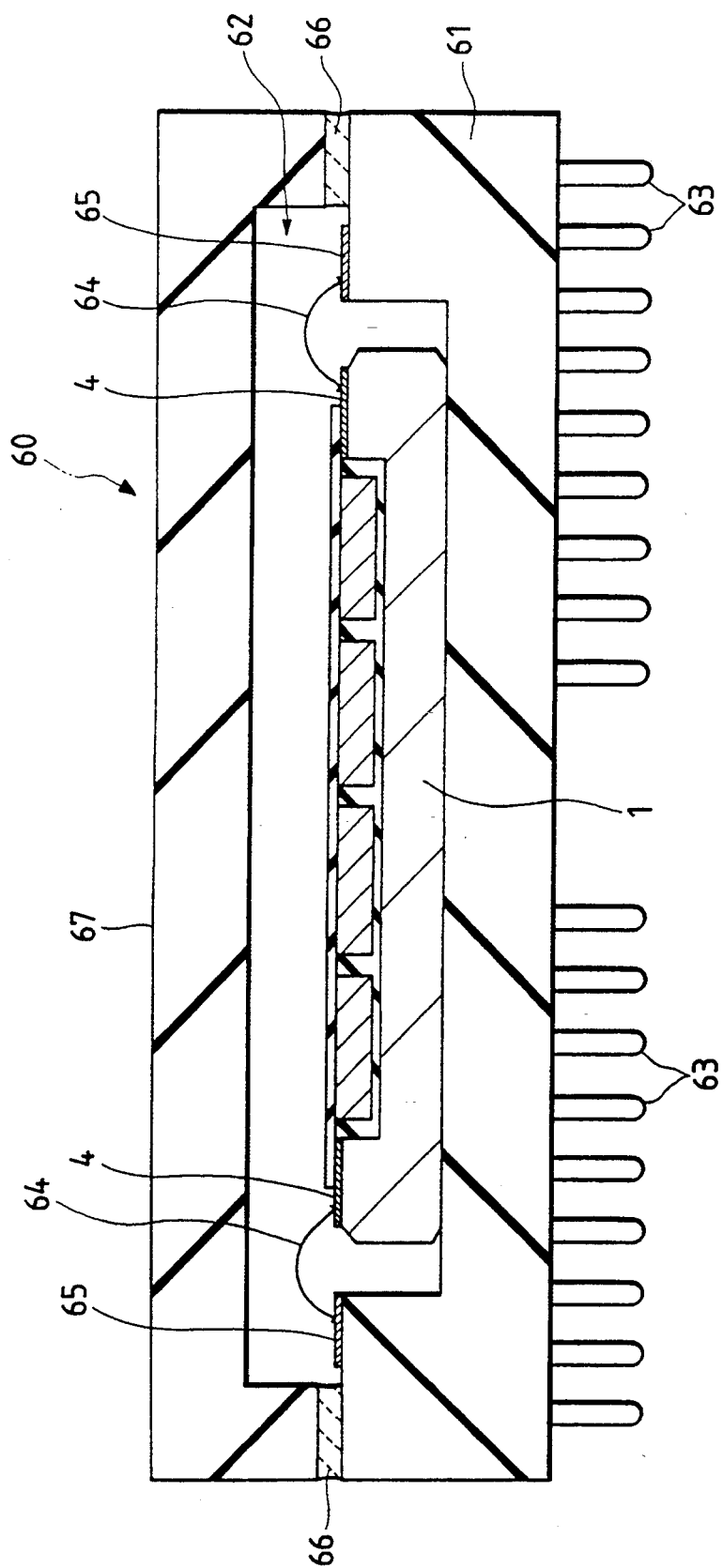
FIG. 14 is section showing a package sealing the multi-chip module.

FIG. 14 shows one example of a multi-chip module having the aforementioned substrate 1 sealed up.

The substrate 1 is sealed with a solder or adhesive in a cavity 62 of a package substrate 61. This package substrate 61 is made of a ceramic material such as mullite or aluminum nitride and is equipped on its lower surface with a predetermined number of lead pins 63. The lead wires 4 of the substrate 1 are connected with the lead wires 65 of the package substrate 61 through bonding wires 64 which are made of Al or Au. Moreover, the lead wires 65 are connected with the lead pins 63 through the (not-shown) internal wires of the package substrate 61. In other words, the semiconductor chips 3 mounted on the substrate 1 are connected with the lead pins 63 through the wires 7 and 9, the lead wires 4, the bonding wires 64, the lead wires 65 and the internal wires of the package substrate 61. A cap 67 is mounted through a sealing member 66 such as glass on the outer periphery of the main surface of the package substrate 61. The cap 67 is made of a ceramic material such as mullite or aluminum nitride.

Figure 18:
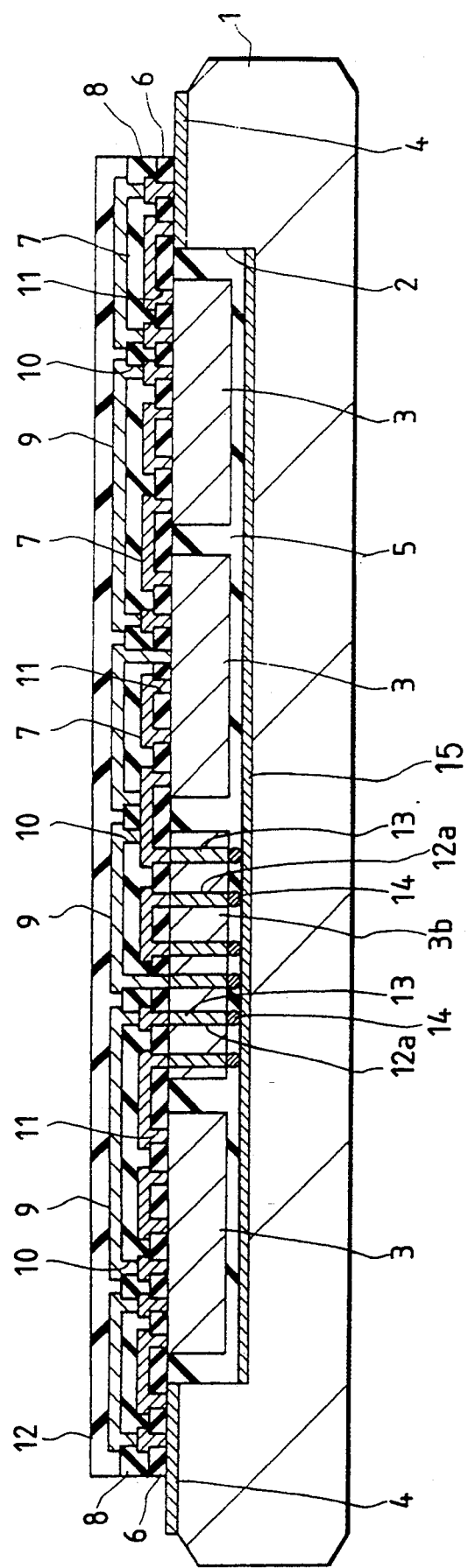
FIG. 18 is a section showing a multi-chip module according to another embodiment of the present invention.

In the multi-chip module of the embodiment thus far described, the wiring layer is formed only on the main surfaces of the semiconductor chips 3, 3, - - - , and so on mounted on the substrate 1. As shown in FIG. 18, however, the wires 15 can be increased at the side of the substrate 1 to improve the wiring density thereby to realize a larger-scale system. Since, in this case, the pattern for the power supply wires is substantially shared for most kinds, it is recommendable to use the wires 15 at the substrate 1 as the power supply wires and the wires 7 and 9 on the main surfaces of the semiconductor chips 3 as the signal wires.

The connections between the wires 15 of the substrate 1 and the wires 7 and 9 on the main surfaces of the semiconductor chips 3, 3, - - - , and so on are effected through wiring chips 3b which are bonded onto the wires 15 with their faces down. The wiring chips 3b are formed with through holes 12a which are equipped therein with internal wires 13. These internal wires 13 have their one-end terminals connected with the wires 7 and their other terminals connected with CCB bumps 14. The through holes 12a of the wiring chips 3b are opened by the anisotropic etching using an aqueous solution of KOH or ethylenediamine, for example. On the other hand, the internal wires 13 in the through holes 12 are formed by burying an electro-formed metal. The connections between the internal wires 13 and the CCB bumps 14 are accomplished by the solder ball feeding method.

Although our invention has been specifically described in connection with the embodiments thereof, it should not be limited to the embodiments but can naturally be modified in various manners without departing the scope thereof.

The wiring layer to be formed on the main surfaces of the semiconductor chips may be formed of one or three or more layers.

When the semiconductor chips are to be mounted on the substrate, the substrate may be formed in advance with a number of holes having a size substantially equal to that of the semiconductor chips, to bury the semiconductor chips one by one in the individual holes.

The material for the substrate may be exemplified by ceramics or synthetic resins.

The package for sealing the substrate may be a resin-sealed type one.

The present invention achieves the following benefits and advantages, for example:

(1) According to the present invention, the wiring layer for connecting the semiconductor chips or the semiconductor chips and the substrate or the insulating film below the wiring layer is worked by the direct drawing method, so that the area of each semiconductor chip can be reduced to achieve a highly integrated multi-chip module.

(2) According to the present invention, the testing pads are arranged in the regions of the scribe lines, or the testing circuits are arranged outside of the semiconductor chips, so that the area of each semiconductor chip can be reduced to achieve a highly integrated multi-chip module easily.

(3) According to the present invention, the single-chip microcomputer having a predetermined system function is mounted together with the RAM, ROM or random logic on the substrate so that the system scale can be hierarchically enlarged on the substrate.

(4) According to the present invention, the steps of designing and preparing the substrate for different systems and mounting the semiconductor chips on different substrate can be eliminated to shorten the development term of the multi-chip module and to reduce the production cost of the same.

(5) According to the present invention, the step of preparing the wiring photo mask for different systems can be eliminated to shorten the development term of the multi-chip module and to reduce the production cost of the same.

What is claimed is:

1. A process for manufacturing a multi-chip module, comprising the steps of:

mounting on a substrate first and second semiconductor chips formed with a plurality of semiconductor elements on circuit forming surfaces and having different functions, and each of said first and second semiconductor chips having a mark;

measuring the position of said marks of said first and second semiconductor chips to obtain measured data of said marks;

transforming said measured data of said marks into positional coordinates in relation to said substrate to obtain transformed data of said marks;

forming an insulating film over said circuit forming surfaces of said first and second semiconductor chips;

forming first and second connection holes in said insulating film over said circuit forming surfaces of said first and second semiconductor chips using said transformed data of said marks of said first and second chips; and forming a wiring layer across said first and second connection holes to connect said first and second semiconductor chips electrically.

2. A process according to claim 1, wherein said first and second semiconductor chips are tested before said step of mounting on said substrate.

3. A process according to claim 2, wherein said first and second semiconductor chips have their circuit forming surfaces arranged therearound with scribe areas, in which testing pads are arranged.

4. A process according to claim 3, wherein the tests are accomplished in a wafer state.

5. A process according to claim 4, wherein said tests are accomplished in the wafer state before said first and second semiconductor chips are diced.

6. A process according to claim 2, wherein the tests are accomplished in a wafer state.

7. A process according to claim 2, wherein said wafer is arranged with testing circuits.

8. A process according to claim 1, wherein said first and second holes are formed by a direct laser or electron beam drawing method.

9. A process according to claim 1, wherein said first and second semiconductor chips are shaped square and said marks are positioned at the four corners of each of said first and second semiconductor chips.

10. A process according to claim 9, wherein said substrate is shaped square and marks are positioned at the four corners of said substrate.

11. A process for manufacturing a multi-chip module, comprising the steps of:

mounting on a substrate at least one semiconductor chip formed with a plurality of semiconductor elements with marks formed on a circuit forming surface thereof;

measuring the position of said marks relative to said substrate to obtain measured data of said marks;

transforming said measured data of said marks into positional coordinates in relation to said substrate to obtain transformed data of said marks;

forming an insulating film over said circuit forming surface of said semiconductor chip and said substrate;

forming first and second connection holes in said insulating film over said circuit forming surface of said semiconductor chip and said substrate using said transformed data of said mark of said chip; and forming a wiring layer across said first and second connection holes to electrically connect said semiconductor chip and said substrate.

12. A process according to claim 11, wherein said first and second holes are formed by a direct laser or electron beam drawing method.

13. A process according to claim 11, wherein said semiconductor chip is shaped square and said marks are positioned at the four corners of said semiconductor chip.

14. A process according to claim 12, wherein said substrate is shaped square and said marks are positioned at the four corners of said substrate.

15. A process for manufacturing a multi-chip module comprising the steps of:

mounting on a substrate a first semiconductor chip having a plurality of semiconductor elements, first wirings and a first mark on a circuit forming surface thereof, and a second semiconductor chip having a plurality of semiconductor elements, second wirings and a second mark on a circuit forming surface thereof;

measuring the position of said first and second marks of said first and second semiconductor chips to obtain measured data of said marks;

transforming said measured data of said first and second marks into positional coordinates in relation to said substrate to obtain transformed data of said marks;

forming a conductive film over said first and second wirings of said first and second semiconductor chips;

forming third wirings from said conductive film, each connecting one of said first wiring and one of said second wirings over said circuit forming surfaces of said first and second semiconductor chips using said transformed data of said marks of said first and second chips.

16. A process according to claim 15, wherein said third wirings are formed by a direct electron beam drawing method.

17. A process according to claim 16, wherein said first and second chips are shaped square and said first and second marks are positioned at four corners of each of said first and second semiconductor chips.

18. A process according to claim 16, wherein said first and second semiconductor chips are tested before said step of mounting on said substrate.

19. A process according to claim 18, wherein each of said first and second semiconductor chips is tested in a wafer state.

20. A process according to claim 19, wherein each of said first and second semiconductor chips is tested before said first and second semiconductor chips are diced.

21. A process according to claim 16, wherein each of said first and second semiconductor chips has said circuit forming surface arranged therearound with scribe area, in which testing pads are arranged.

22. A process according to claim 15, wherein said third wirings are formed by a direct laser beam drawing method.

* * * * *